United States Patent
Kim et al.

(10) Patent No.: US 9,502,485 B2
(45) Date of Patent: Nov. 22, 2016

(54) ORGANIC LIGHT-EMITTING DIODE DISPLAY HAVING LIGHT-BLOCKING PORTIONS OF BLACK MATRIX WITH DIFFERING LIGHT TRANSMITTANCES

(71) Applicant: Samsung Display Co., Ltd., Yongin, Gyeonggi-Do (KR)

(72) Inventors: Hyunho Kim, Yongin (KR); Sooyoun Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/691,343

(22) Filed: Apr. 20, 2015

(65) Prior Publication Data

US 2016/0172426 A1   Jun. 16, 2016

(30) Foreign Application Priority Data

Dec. 11, 2014   (KR) .................. 10-2014-0178704

(51) Int. Cl.
    *H01L 27/32*     (2006.01)
    *H01L 51/56*     (2006.01)
    *H01L 51/52*     (2006.01)

(52) U.S. Cl.
    CPC ......... *H01L 27/3258* (2013.01); *H01L 27/326* (2013.01); *H01L 51/5237* (2013.01); *H01L 51/5284* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 6,268,662 B1* | 7/2001 | Test | ...................... | H01L 21/563 257/773 |
| 7,075,161 B2* | 7/2006 | Barth | ............... | G01N 33/48721 257/414 |
| 8,324,699 B2* | 12/2012 | Ichijo | ...................... | C23C 16/02 257/228 |
| 2002/0015292 A1* | 2/2002 | Pritchett | ................. | H01L 25/18 361/780 |
| 2005/0287692 A1* | 12/2005 | Kim | .................. | G02F 1/136286 438/30 |
| 2009/0021169 A1 | 1/2009 | Kweon | | |
| 2014/0284572 A1* | 9/2014 | Oooka | .................. | H01L 51/525 257/40 |
| 2014/0306250 A1* | 10/2014 | Gardner | .............. | H01L 25/0753 257/89 |
| 2014/0367652 A1* | 12/2014 | Cho | .................... | H01L 27/3244 257/40 |
| 2015/0185549 A1* | 7/2015 | Jeon | .................. | G02F 1/133512 349/106 |

FOREIGN PATENT DOCUMENTS

| | | |
|---|---|---|
| JP | 2009-198904 A | 9/2009 |
| KR | 10-2007-0113412 A | 11/2007 |
| KR | 10-2008-0082164 A | 9/2008 |
| KR | 10-2009-0008609 A | 1/2009 |

* cited by examiner

*Primary Examiner* — Michael Jung
(74) *Attorney, Agent, or Firm* — Knobbe Martens Olson & Bear LLP

(57) ABSTRACT

Organic light-emitting diode (OLED) displays and methods of manufacturing OLD displays are disclosed. In one aspect, an OLED display includes a substrate having an emission area and a non-emission area, a pixel electrode formed in the emission area, and an intermediate layer formed over the pixel electrode and including an organic emission layer. The display also includes an opposite electrode formed in the emission and non-emission areas and at least partially covering the intermediate layer. The display further includes a black matrix formed over the opposite electrode and including a first light-blocking portion formed in the non-emission area and a second light-blocking portion formed in the emission area and having light transmittance greater than that of the first light-blocking portion.

10 Claims, 14 Drawing Sheets

ORGANIC LIGHT-EMITTING DIODE DISPLAY HAVING LIGHT-BLOCKING PORTIONS OF BLACK MATRIX WITH DIFFERING LIGHT TRANSMITTANCES

RELATED APPLICATION

This application claims the benefit of Korean Patent Application No. 10-2014-0178704, filed on Dec. 11, 2014, in the Korean Intellectual Property Office, the disclosure of which is incorporated herein in its entirety by reference.

BACKGROUND

Field

The described technology generally relates to an organic light-emitting diode display and a method of manufacturing the same.

Description of the Related Technology

An organic light-emitting diode (OLED) display includes a matrix of OLEDs each including hole injection electrodes, electron injection electrodes, and organic emission layers formed between the hole injection electrodes and the electron injection electrodes. Holes injected from the hole injection electrodes and electrons injected from the electron injection electrodes combine in the organic emission layers and generate excitons. Thus, light is generated as the excitons drop from an excited state to a ground state.

Since a separate light source is unnecessary, the OLED display can be driven at a low voltage and be configured to be lightweight and thin. Due to their excellent viewing angles, contrasts, response times, and other favorable characteristics, OLED displays are widely used in personal portable devices, such as MP3 players and mobile phones, TVs, etc.

Much research has been conducted to develop the OLED display for flexible applications, for example, a foldable or rollable display.

SUMMARY OF CERTAIN INVENTIVE ASPECTS

One inventive aspect relates to an OLED display that is flexible and has improved visibility and a method of manufacturing the same so as to solve the above problems.

Another aspect is an OLED display that includes a substrate including an emission area and a non-emission area; a pixel electrode formed in the emission area of the substrate; an intermediate layer formed on the pixel electrode and including an organic emission layer; an opposite electrode formed in the emission area and the non-emission area of the substrate and covering the intermediate layer; and a black matrix including a first light-blocking unit in an area corresponding to the non-emission area and a second light-blocking unit in an area corresponding to at least the emission area and having a greater light transmittance than the first light-blocking unit, on the opposite electrode.

A visible light transmittance of the first light-blocking unit can be about 0.2% or less and a visible light transmittance of the second light-blocking unit can be about 40% to about 70%.

The first light-blocking unit can have a first thickness and the second light-blocking unit can have a second thickness, the second thickness can be smaller than the first thickness.

The first light-blocking unit and the second light-blocking unit can include a substantially identical material.

The first thickness can be about 0.8 µm or more, and the second thickness can be about 0.1 µm to about 0.5 µm.

The first and second light-blocking units can have a substantially identical third thickness.

The black matrix can include a resin including black pigments, and a density of black pigments in the first light-blocking unit can be greater than a density of black pigments in the second light-blocking unit.

The third thickness can be about 0.8 µm or more.

The OLED display can further include an encapsulating substrate that faces the substrate. The black matrix can be on a surface of the encapsulating substrate, the surface facing the substrate.

The OLED display can further include a thin film encapsulating layer between the opposite electrode and the black matrix.

Another aspect is a method of manufacturing an OLED display that includes forming a pixel electrode in an emission area of a substrate including the emission area and a non-emission area; forming an intermediate layer including an organic emission layer on the pixel electrode; forming an opposite electrode in the emission area and the non-emission area of the substrate to cover the intermediate layer; and forming a black matrix including a first light-blocking unit in an area corresponding to the non-emission area and a second light-blocking unit in an area corresponding to at least the emission area and having a greater light transmittance than the first light-blocking unit, on the opposite electrode.

A visible light transmittance of the first light-blocking unit can be about 0.2% or less and a visible light transmittance of the second light-blocking unit can be about 40% to about 70%.

The forming of the black matrix can include forming a light-blocking material to a first thickness in the non-emission area and the emission area on the opposite electrode; irradiating light onto the non-emission area by using a mask including a hole corresponding to the non-emission area; and forming the second light-blocking unit to a second thickness by developing the light-blocking material and removing a portion of the light-blocking material formed in the emission area.

The first thickness can be about 0.8 µm or more, and the second thickness can be about 0.1 µm to about 0.5 µm.

The forming of the black matrix can include forming the second light-blocking unit to a fifth thickness in the emission area and the non-emission area; and forming the first light-blocking unit to a fourth thickness in the non-emission area of the second light-blocking unit. The fifth thickness can be about 0.1 µm to about 0.5 µm, and a sum of the fourth thickness and the fifth thickness can be about 0.8 µm or more.

The forming of the black matrix can include forming the first light-blocking unit to a third thickness in the non-emission area; and forming the second light-blocking unit to the third thickness in the emission area.

The first light-blocking unit can include a resin including black pigments, and the second light-blocking unit can include a resin including black pigments that have a lower density than the black pigments of the first light-blocking unit.

The third thickness can be about 0.8 µm or more.

The method can further include forming an encapsulating substrate to face the substrate; forming the black matrix on a surface of the encapsulating substrate, the surface facing the substrate; and aligning the substrate and the encapsulating substrate.

The method can further include, after the forming of the opposite electrode, forming a thin film encapsulating layer on the opposite electrode.

Another aspect is an organic light-emitting diode (OLED) display, comprising a substrate having an emission area and a non-emission area, a pixel electrode formed in the emission area, an intermediate layer formed over the pixel electrode and comprising an organic emission layer, an opposite electrode formed in the emission and non-emission areas and at least partially covering the intermediate layer; and a black matrix formed over the opposite electrode and comprising i) a first light-blocking portion formed in the non-emission area and ii) a second light-blocking portion formed in the emission area and having light transmittance greater than that of the first light-blocking portion.

In the above display, the light transmittance of the first light-blocking portion is about 0.2% or less, wherein the light transmittance of the second light-blocking portion is about 40% to about 70%.

In the above display, the first light-blocking portion has a first thickness and the second light-blocking portion has a second thickness less than the first thickness.

In the above display, the first and second light-blocking portions are formed of the same material.

In the above display, the first thickness is about 0.8 μm or more, wherein the second thickness is about 0.1 μm to about 0.5 μm.

In the above display, the first and second light-blocking portions have substantially the same thickness.

In the above display, the black matrix is formed of a resin comprising black pigments, wherein the density of the black pigments in the first light-blocking portion is greater than the density of black pigments in the second light-blocking portion.

In the above display, the thickness of the first and second light-blocking portions is about 0.8 μm or more.

The above OLED display further comprises an encapsulating substrate facing the substrate, wherein the black matrix is formed over a surface of the encapsulating substrate, and wherein the surface faces the substrate.

In the above display, the opposite electrode has concave portions facing away from the substrate, wherein the first light-blocking portions are substantially rectangular and formed over the concave portions.

Another aspect is a method of manufacturing an OLED display, the method comprising providing a substrate having an emission area and a non-emission area, forming a pixel electrode in the emission area, forming an intermediate layer comprising an organic emission layer over the pixel electrode, forming an opposite electrode in the emission and non-emission areas so as to at least partially cover the intermediate layer, and forming a black matrix over the opposite electrode and comprising i) a first light-blocking portion over the non-emission area and ii) a second light-blocking portion formed over at least the emission area and having light transmittance greater than that of the first light-blocking portion.

In the above method, the light transmittance of the first light-blocking portion is about 0.2% or less, wherein the light transmittance of the second light-blocking portion is about 40% to about 70%.

In the above method, the forming of the black matrix comprises providing a light-blocking material having a first thickness in the non-emission area and the emission area over the opposite electrode, irradiating light onto the non-emission area through a mask having at least one hole corresponding to the non-emission area, developing the light-blocking material, and removing a portion of the light-blocking material formed in the emission area so as to form the second light-blocking portion having a second thickness.

In the above method, the first thickness is about 0.8 μm or more, wherein the second thickness is about 0.1 μm to about 0.5 μm.

In the above method, the forming of the black matrix comprises forming the first light-blocking portion having a third thickness in the non-emission area and forming the second light-blocking portion having the third thickness in the emission area.

In the above method, the first light-blocking portion is formed of a resin comprising black pigments, wherein the second light-blocking portion is formed of a resin comprising black pigments having a density less than that of the black pigments of the first light-blocking portion.

In the above method, the third thickness is about 0.8 μm or more.

In the above method, the forming of the black matrix comprises forming the first light-blocking portion having a fourth thickness in the non-emission area of the second light-blocking portion, forming the second light-blocking portion having a fifth thickness in the emission and non-emission areas, wherein the fifth thickness is about 0.1 μm to about 0.5 μm, and wherein the sum of the fourth and fifth thicknesses is about 0.8 μm or more.

The above method further comprises forming an encapsulating substrate having a surface facing the substrate, forming the black matrix over the surface of the encapsulating substrate, and aligning the substrate and the encapsulating substrate.

In the above method, the opposite electrode has concave portions facing away from the substrate, and wherein the first light-blocking portions are substantially rectangular and formed over the concave portions.

DETAILED DESCRIPTION OF CERTAIN INVENTIVE EMBODIMENTS

Figure 1:
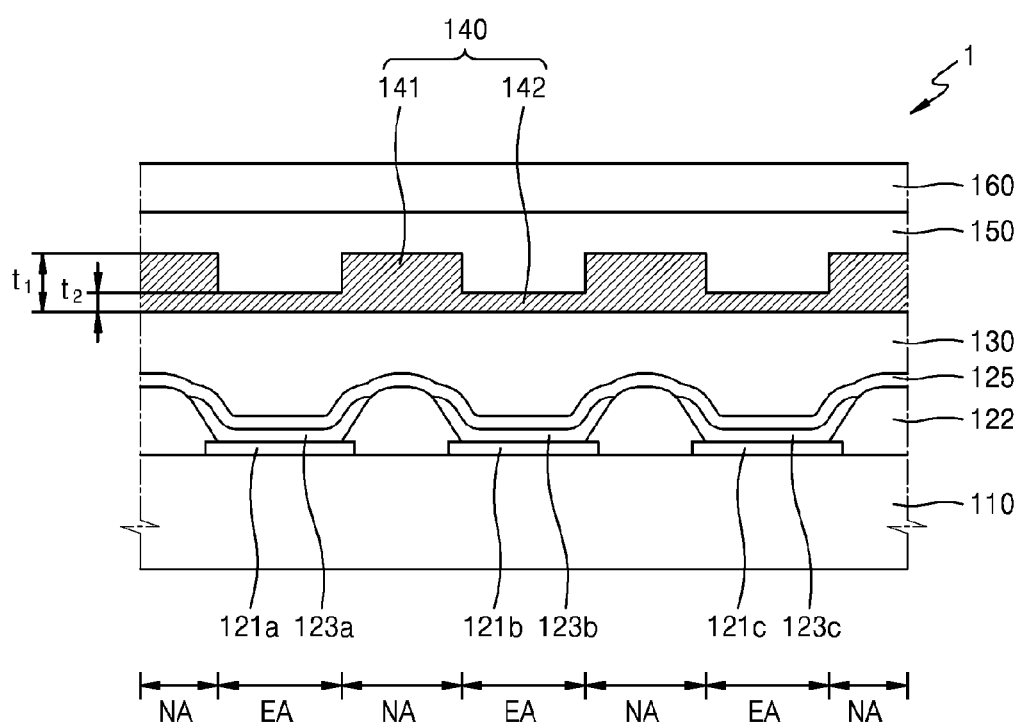
FIG. 1 is a cross-sectional view schematically illustrating an OLED display according to an exemplary embodiment.

Although typical OLED displays (not necessarily prior art) include a circular polarizing film to improve visibility thereof, the circular polarizing film has a thickness of about 100 μm or more, and thus, these OLED displays are not flexible.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed item. Expressions such as "at least one of," when preceding a list of elements, modify the entire list of elements and do not modify the individual elements of the list.

It will be understood that although the terms "first", "second", etc. can be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a cross-sectional view schematically illustrating an OLED display 1 according to an exemplary embodiment.

Referring to FIG. 1, the OLED display 1 according to an exemplary embodiment includes a substrate 110 having an emission area EA and a non-emission area NA, and pixel electrodes 121a, 121b, and 121c formed in the emission area EA. the OLED display 1 also includes intermediate layers 123a, 123b, and 123c including organic emission layers and formed on the pixel electrodes 121a, 121b, and 121c, an opposite electrode 125 formed in the emission area EA and the non-emission area NA to cover the intermediate layers 123a, 123b, and 123c, and a black matrix 140 including a first light-blocking unit or first light-blocking portion 141 formed in an area corresponding to the non-emission area NA and a second light-blocking unit or second light-blocking portion 142 formed in an area corresponding to at least the emission area EA and having light transmittance greater than that of the first light-blocking unit 141, on the opposite electrode 125.

The substrate 110 can include a thin film transistor (TFT) array substrate formed by forming driving devices such as TFTs (not shown) on a base substrate that can be a flexible substrate. For example, the base substrate is formed of plastic with excellent heat-resistance and durability such as polyimide, polyethylene terephthalate (PET), polycarbonate, polyethylene naphtalate, polyacrylate (PAR), and polyetherimide.

The substrate 110 includes the emission area EA and the non-emission area NA. The emission area EA can include sub-pixel areas that emit different colors of light. For example, the emission area EA includes, but is not limited to, a red sub-pixel, a green sub-pixel, and a blue sub-pixel that respectively emit red light, green light, and blue light.

Each of the pixel electrodes 121a, 121b, and 121c can be a reflection electrode that includes a reflection layer. For example, the reflection layer is formed of at least one of silver (Ag), magnesium (Mg), aluminum (Al), platinum (Pt), palladium (Pd), gold (Au), nickel (Ni), neodymium (Nd), iridium (Ir), and chrome (Cr). A transparent or semi-transparent electrode layer can be additionally formed on the reflection layer from one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrodes 121a, 121b, and 121c is formed as a 3-layer structure of ITO/Ag/ITO.

Both edges of each of the pixel electrodes 121a, 121b, and 121c can be covered by a pixel defining layer (PDL) 122 that can define the emission area EA.

The intermediate layers 123a, 123b, and 123c can be formed in areas of the pixel electrodes 121a, 121b, and 121c which are exposed by the PDL 122. Each of the intermediate layers 123a, 123b, and 123c includes an organic emission layer and can further include at least one selected from a hole injection layer (HIL), a hole transport layer (HTL), an electron transport layer (ETL), and an electron injection layer (EIL). However, the embodiments are not limited thereto, and each of the intermediate layers 123a, 123b, and 123c includes an organic emission layer and can further include other various functional layers.

When an OLED is a full color OLED, the organic emission layer can be patterned to form a red emission layer, a green emission layer, and a blue emission layer according to the red sub-pixel, the green sub-pixel, and the blue sub-pixel.

The organic emission layer can have a multi-layer structure formed by stacking the red emission layer, the green emission layer, and the blue emission layer so that white light is emitted, or a single layer structure formed of a red light-emitting material, a green light-emitting material, and a blue light-emitting material. The OLED including the above-described organic emission layer can emit full colors by further including a red color filter, a green color filter, and a blue color filter.

The opposite electrode 125 can be formed over both the emission area EA and the non-emission area NA, and can include a semi-transparent electrode that transmits some rays of light and reflects other rays of light.

The opposite electrode 125 can be formed of a material having a product of a refractive index and an extinction ratio equal to 10 or less in a visible light area, a low absorption rate, and a high reflectance. For example, the opposite electrode 125 is formed of at least one selected from Ag, Al, ytterbium (Yb), Ti, Mg, Ni, lithium (Li), calcium (Ca), copper (Cu), LiF/Ca, LiF/Al, MgAg, and CaAg. The at least one selected material can be formed as a thin film having a thickness of few to several nm so that the thin film has a certain degree of transmittance.

The opposite electrode 125 can be formed as a semi-transparent electrode so that the pixel electrodes 121a, 121b, and 121c and the opposite electrode 125 form a microcavity. That is, some light rays emitted from the intermediate layers 123a, 123b, and 123c formed between the pixel electrodes 121a, 121b, and 121c and the opposite electrode 125 can travel back and forth between the pixel electrodes 121a, 121b, and 121c and the opposite electrode 125, and light rays having a certain wavelength that satisfies a constructive interference condition can be amplified during the travelling and be emitted toward the opposite electrode 125.

The intermediate layers 123a, 123b, and 123c can include a resonance length adjusting layer that is formed above and/or under the organic emission layers and can adjust a distance between the pixel electrodes 121a, 121b, and 121c and the opposite electrode 125 according to a wavelength of light rays emitted from the organic emission layers.

A thin film encapsulating layer 130 can be formed between the opposite electrode 125 and the black matrix 140. The thin film encapsulating layer 130 can include at least one inorganic layer and at least one organic layer. The total thickness of the thin film encapsulating layer 130 can be about 2 μm to about 20 μm. The above range can provide an optimum balance between an efficient performance of an encapsulation function and the flexibility of an OLED display. However, depending on embodiments, the total thickness can be less than about 2 μm or greater than about 20 μm.

The at least one inorganic layer included in the thin film encapsulating layer 130 can be formed of a metal oxide, a metal nitride, a metal carbide, or a combination thereof, for example, Al oxide, silicon oxide, or silicon nitride. The at least one inorganic layer can block external moisture and/or oxygen from penetrating through the intermediate layers 123a, 123b, and 123c.

The at least one organic layer included in the thin film encapsulating layer 130 can be formed of a polymer organic compound including any one selected from epoxy, acrylate, and urethane acrylate. The at least one organic layer can reduce internal stress of the inorganic layer and compensate for defects of and planarize the inorganic layer.

In the OLED display 1 according to an exemplary embodiment, a base substrate can be a flexible substrate and the thin film encapsulating layer 130 can be included as an encapsulating unit, and thus, a flexible OLED display 1 can be easily manufactured.

The black matrix 140 can be formed on the thin film encapsulating layer 130. The black matrix 140 can include the first light-blocking unit 141 in the non-emission area NA and the second light-blocking unit 142 in the emission area EA.

The black matrix 140 can block external light reflection so that visibility of the OLED display 1 is improved. According to an exemplary embodiment, a visible light transmittance (or light transmittance) of the first light-blocking unit 141 can be about 0.2% or less and a visible light transmittance (or light transmittance) of the second light-blocking unit 142 can be about 40% to about 70%.

When the visible light transmittance of the first light-blocking unit 141 exceeds about 0.2%, the effect of the external light reflection can be decreased. That is, since the first light-blocking unit 141 is located in the non-emission area NA, the visible light transmittance can be minimized so that external light reflection is efficiently prevented. However, depending on embodiments, the visible light transmittance of the first light-blocking unit 141 can be greater than about 0.2%.

That is, since the second light-blocking unit 142 is formed on the emission area EA, light rays emitted from the intermediate layers 123a, 123b, and 123c can pass through the second light-blocking unit 142 and travel to the environment. The second light-blocking unit 142 can have greater visible light transmittance than that of the first light-blocking unit 141, for example, a visible light transmittance of about 40% or more. The above range can provide an optimum balance between light extraction efficiency and an external light reflection prevention effect of the emission area EA. However, depending on embodiments, the visible light transmittance of the second light-blocking unit 142 can be less than about 40% or greater than about 70%.

According to an exemplary embodiment, the first light-blocking unit 141 and the second light-blocking unit 142 can include a substantially identical material, for example, a photosensitive resin including black pigments. The first and second light-blocking units 141 and 142 can have different thicknesses and thus have different visible light transmittances. That is, the first light-blocking unit 141 can have a first thickness $t_1$ and the second light-blocking unit 142 can have a second thickness $t_2$ that is less than the first thickness $t_1$.

According to an exemplary embodiment, the first thickness $t_1$ can be about 0.8 μm or more and the second thickness $t_2$ can be about 0.1 μm to about 0.5 μm. As described above, the first light-blocking unit 141 having the first thickness $t_1$ can have a visible light transmittance (or light transmittance) of about 0.2% or less, and the second light-blocking unit 142 having the second thickness $t_2$ can have a visible light transmittance (or light transmittance) of about 40% to about 70%. However, depending on embodiments, the first thickness $t_1$ can be greater than about 0.8 μm and the second thickness $t_2$ can be less than about 0.1 μm or greater than about 0.5 μm.

According to an exemplary embodiment, the first light-blocking unit 141 and the second light-blocking unit 142 can be formed in one body. A step can be formed due to the difference between respective thicknesses of the first light-blocking unit 141 and the second light-blocking unit 142. The first light-blocking unit 141 and the second light-blocking unit 142 can be easily manufactured according to a masking process, which will be described later.

An overcoat film 150 can be formed on the black matrix 140, and a window 160 can be formed on the overcoat film 150. According to an exemplary embodiment, the OLED display 1 efficiently prevents external light reflection without using a polarizer that is generally used in this regard and also can be easily manufactured to be flexible.

FIGS. 2A to 2D are cross-sectional views sequentially illustrating a method of manufacturing the OLED display 1 of FIG. 1.

Figure 2A:
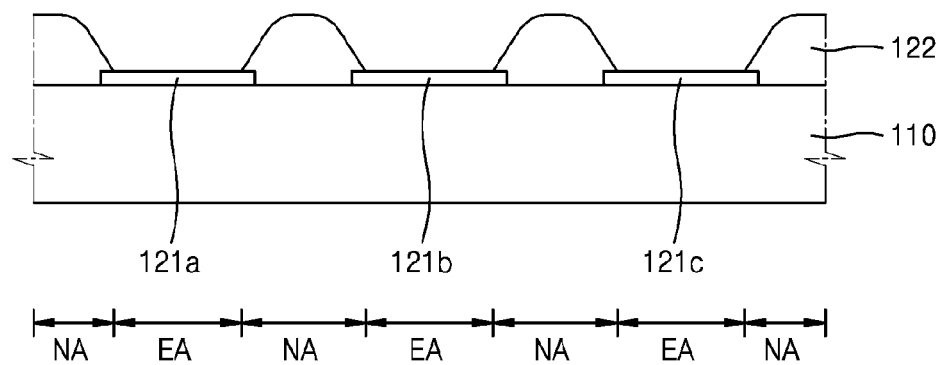
FIGS. 2A to 2D are cross-sectional views sequentially illustrating a method of manufacturing the OLED display of FIG. 1.

Referring to FIG. 2A, the method includes forming the pixel electrodes 121a, 121b, and 121c on the emission area EA of the substrate 110 and forming the PDL 122 that covers both edges of each of the pixel electrodes 121a, 121b, and 121c.

Each of the pixel electrodes 121a, 121b, and 121c can be a reflection electrode that includes a reflection layer. For example, the reflection layer is formed of at least one of Ag, Mg, Al, Pt, Pd, Au, Ni, Nd, Ir, and Cr. On the reflection layer, a transparent or semi-transparent electrode layer that is formed by one of ITO, IZO, ZnO, $In_2O_3$, IGO, and AZO can be additionally formed. For example, the pixel electrodes 121a, 121b, and 121c is formed as a 3-layer structure of ITO/Ag/ITO.

The pixel electrodes 121a, 121b, and 121c can be formed as islands on sub-pixels corresponding thereto.

Figure 2B:
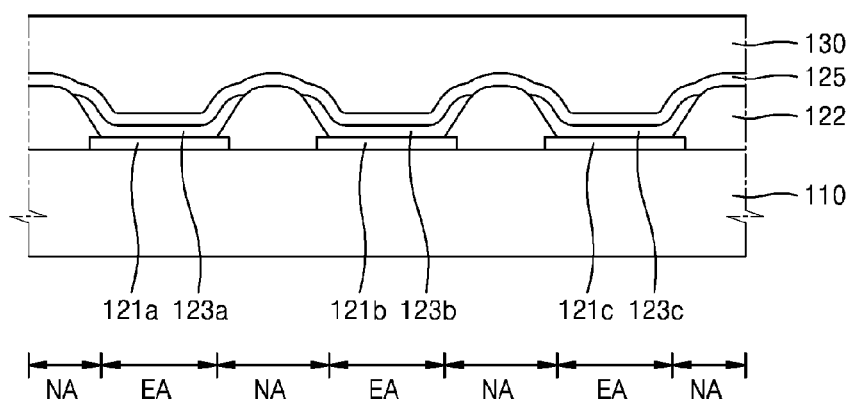

Referring to FIG. 2B, the method of manufacturing the OLED display 1 can include forming the intermediate layers 123a, 123b, and 123c that include organic emission layers on the pixel electrodes 121a, 121b, and 121c, respectively, after forming the PDL 122. The method can also include forming the opposite electrode 125 in the emission area EA and the non-emission area NA to cover the intermediate layers 123a, 123b, and 123c, and forming the thin film encapsulating layer 130 on the opposite electrode 125.

Each of the intermediate layers 123a, 123b, and 123c includes an organic emission layer and can further include at least one selected from a HIL, a HTL, an ETL, and an EIL. The organic emission layers can be patterned as a red emission layer, a green emission layer, and a blue emission layer according to the red sub-pixel, the green sub-pixel, and the blue sub-pixel.

The opposite electrode 125 can be formed in common over the emission area EA and the non-emission area NA, and can be a semi-transparent electrode that transmits some rays of light and reflects the other rays of light. For example, the opposite electrode 125 is formed of at least one of Ag, Al, Yb, Ti, Mg, Ni, Li, Ca, Cu, LiF/Ca, LiF/Al, MgAg, and CaAg. The at least one selected material can be formed as a thin film having a thickness of few to several nm so that the thin film has a certain degree of transmittance.

The thin film encapsulating layer 130 can include at least one inorganic layer and at least one organic layer. The at least one inorganic layer can be formed of a metal oxide, a metal nitride, a metal carbide, or a combination thereof, and the at least one organic layer can be formed of any one selected from epoxy, acrylate, and urethane acrylate.

Figure 2C:
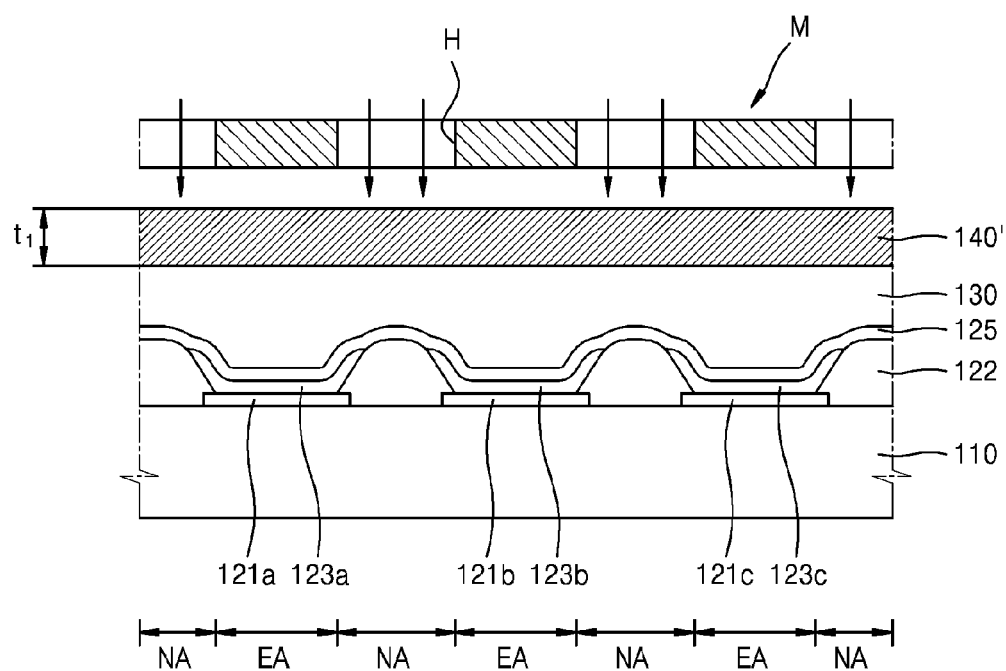
Figure 2D:
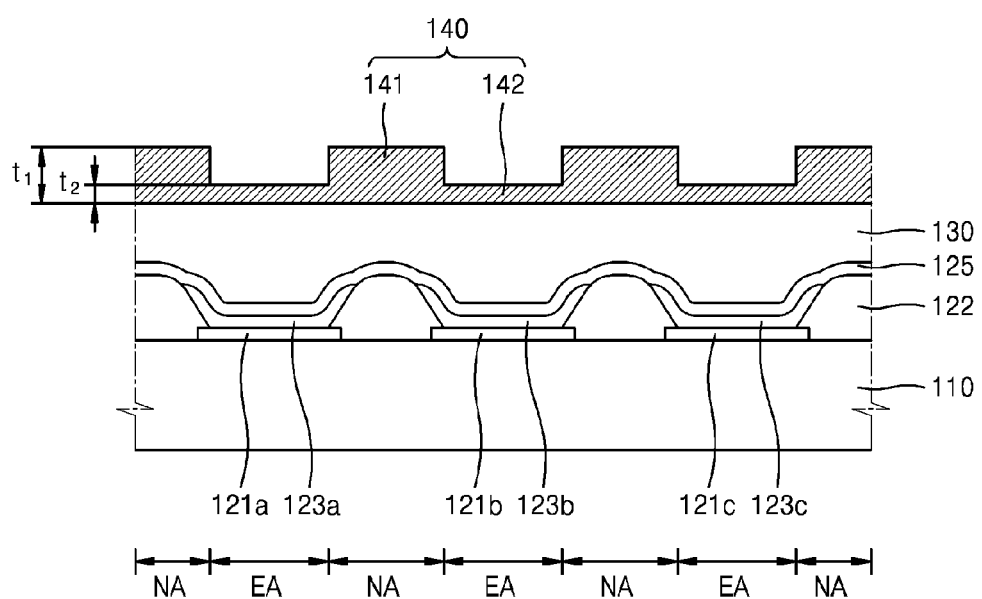

Referring to FIGS. 2C and 2D, the method of manufacturing the OLED display 1 according to an exemplary embodiment include forming a light-blocking material 140' having the first thickness $t_1$ in the non-emission area NA and the emission area EA on the thin film encapsulating layer 130. The method also includes irradiating light onto the non-emission area NA by using a mask M including a hole H corresponding to the non-emission area NA, and forming the second light-blocking unit 142 having the second thickness $t_2$ by developing the light-blocking material 140' and thus removing a portion of the light-blocking material 140' formed in the emission area EA.

The first thickness $t_1$ can be about at least 0.8 μm, and light can be irradiated onto only the non-emission area NA by using the mask M including the hole H corresponding to the non-emission area NA.

The light-blocking material 140' can be a photosensitive resin including black pigments. The resin can be a material that is cured and not easily dissolved when light is irradiated thereon. Therefore, the light-blocking material 140' that is formed in the non-emission area NA, onto which light is irradiated, can be cured and not dissolved when a developing process is performed.

However, the light-blocking material 140' that is formed in the emission area EA, onto which light is not irradiated, can be removed by the developing process. By adjusting a developing time, the second light-blocking unit 142 can be formed to have the second thickness $t_2$ of about 0.1 μm to about 0.5 μm in the emission area EA. For example, a developing time necessary for removing a predetermined thickness of the light-blocking material 140' is calculated based on an already known developing time necessary for removing 1 μm of the light-blocking material 140', and the second light-blocking unit can be formed by performing the developing process performed only for the calculated developing time.

According to the process above, the second light-blocking unit 142 can be formed to have the second thickness $t_2$, and an area that is not developed due to light irradiation can correspond to the first light-blocking unit 141 having the first thickness $t_1$.

After forming the black matrix 140 that includes the first and second light-blocking units 141 and 142, the overcoat film 150 (of FIG. 1) and the window 160 (of FIG. 1) can be formed on the black matrix 140.

Figure 3:
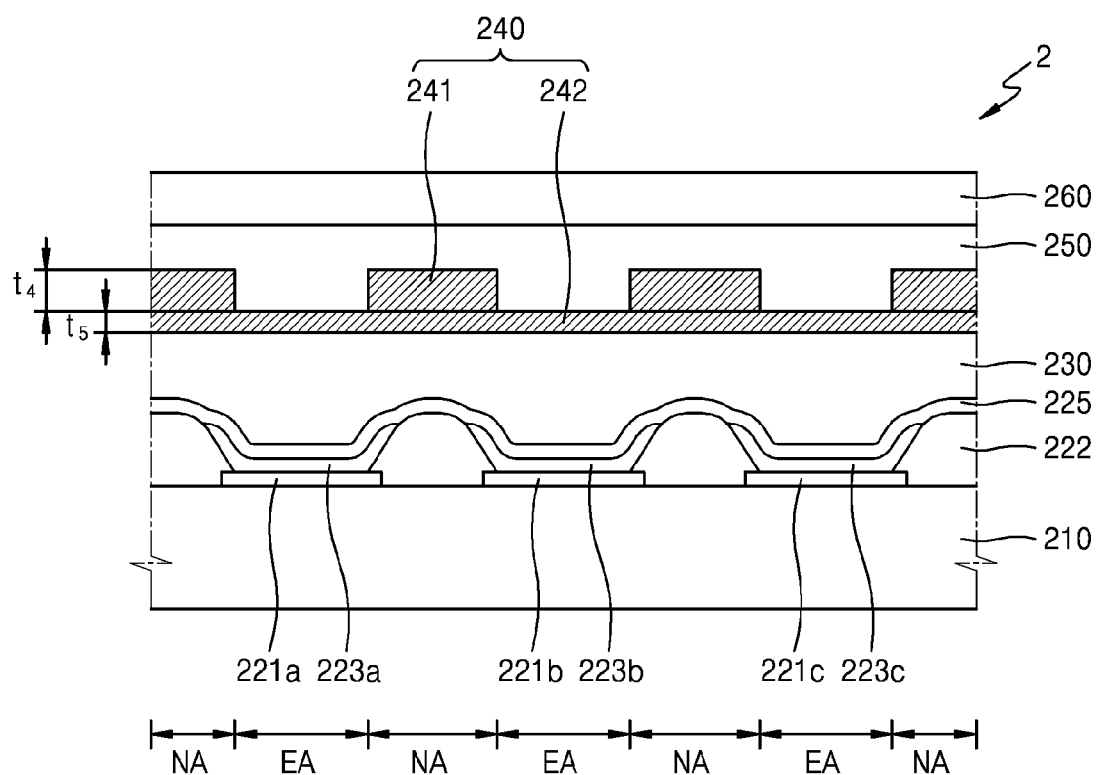
FIG. 3 is a cross-sectional view schematically illustrating an OLED display according to an exemplary embodiment.
Figure 4A:
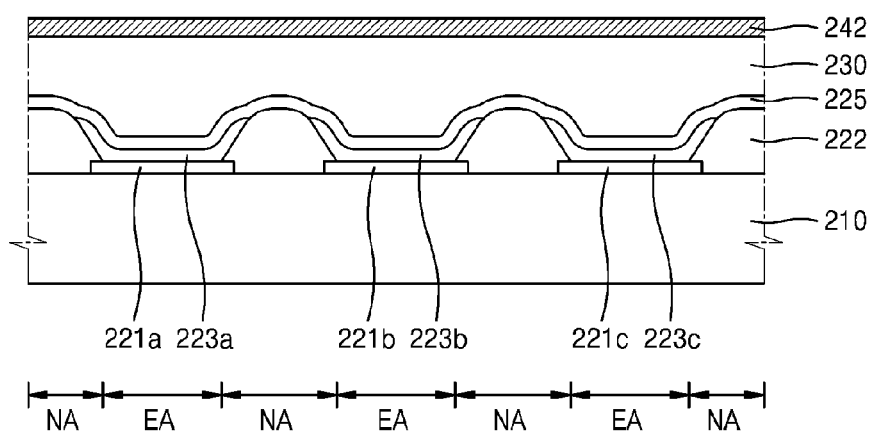
FIGS. 4A and 4B are cross-sectional views sequentially illustrating a part of a method of manufacturing the OLED display of FIG. 3.
Figure 4B:
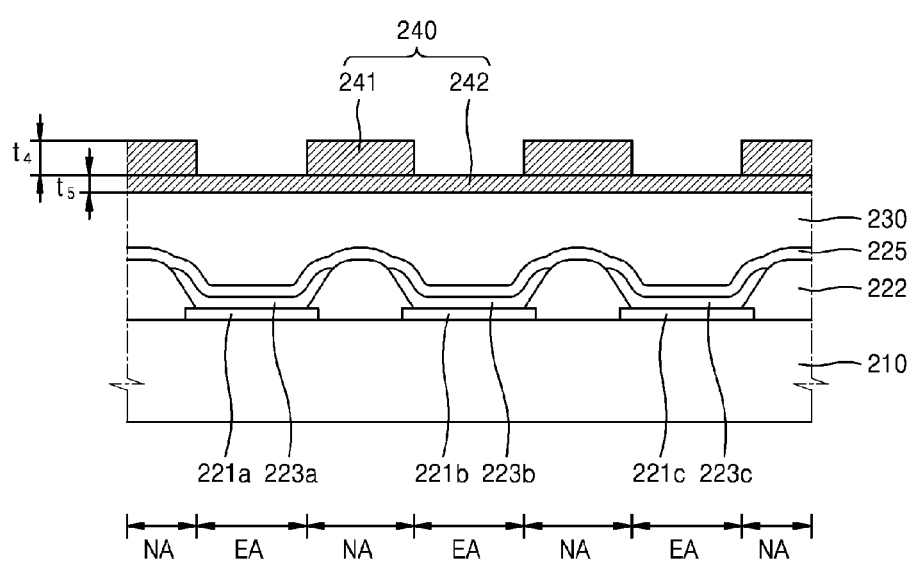

FIG. 3 is a cross-sectional view schematically illustrating an OLED display 2 according to an exemplary embodiment. FIGS. 4A and 4B are cross-sectional views sequentially illustrating a part of a method of manufacturing the OLED display 2 of FIG. 3.

Referring to FIG. 3, the OLED display 2 includes a substrate 210 defined as an emission area EA and a non-emission area NA and pixel electrodes 221a, 221b, and 221c formed on the emission area EA of the substrate 210. The OLED display 2 also includes intermediate layers 223a, 223b, and 223c including organic emission layers and formed on the pixel electrodes 221a, 221b, and 221c, and an opposite electrode 225 formed on the emission area EA and the non-emission area NA to cover the intermediate layers 223a, 223b, and 223c. The OLED display 2 further includes a black matrix 240 including a first light-blocking unit or first light-blocking portion 241 formed on an area corresponding to the non-emission area NA and a second light-blocking unit or second light-blocking portion 242 formed in an area corresponding to at least the emission area EA and having a greater light transmittance than the first light-blocking unit 241, on the opposite electrode 225.

A thin film encapsulating layer 230 can be formed between the opposite electrode 225 and the black matrix 240, and a PDL 222 can cover both edges of each of the pixel electrodes 221a, 221b, and 221c.

The black matrix 240 can be formed on the thin film encapsulating layer 230, and can include the first light-blocking unit 241 located in the non-emission area NA and the second light-blocking unit 242 located in the emission area EA and the non-emission area NA.

The second light-blocking unit 242 can be formed in the emission area EA and the non-emission area NA on the thin film encapsulating layer 230, and the first light-blocking unit 241 can be formed in the non-emission area NA on the second light-blocking unit 242.

According to an exemplary embodiment, the first light-blocking unit 241 and the second light-blocking unit 242 can be formed of a substantially identical material, for example, a photosensitive resin including black pigments. The first light-blocking unit 241 can have a fourth thickness $t_4$ and the second light-blocking unit 242 can have a fifth thickness $t_5$ that are about 0.1 μm to about 0.5 μm. The sum of the fourth thickness $t_4$ and the fifth thickness $t_5$ can be about 0.8 μm or more. However, depending on embodiments, the fifth thickness $t_5$ can have a thickness of less than about 0.1 μm or greater than about 0.5 μm, and the sum of the fourth and fifth thicknesses $t_4$ and $t_5$ can be less than about 0.8 μm.

That is, on the thin film encapsulating layer 230, the second light-blocking unit 242 and the first light-blocking unit 241 can be sequentially formed in the non-emission area NA, but only the second light-blocking unit 242 can be formed in the emission area EA.

The black matrix 240 can prevent external light reflection so that visibility of the OLED display 2 is improved.

According to an exemplary embodiment, respective visible light transmittances of the first light-blocking unit 241 and the second light-blocking unit 242 that are sequentially formed can be about 0.2% or less, and a visible light transmittance of the second light-blocking unit 242 can be about 40% to about 70%.

Referring to FIGS. 4A and 4B, the method of manufacturing the OLED display 2 includes forming the black matrix 240 on the thin film encapsulating layer 230. The forming of the black matrix 240 can include forming the second light-blocking unit 242 to have the fifth thickness $t_5$ in the emission area EA and the non-emission area NA, and forming the first light-blocking unit 241 to have the fourth thickness $t_4$ on the non-emission area NA of the second light-blocking unit 242. The fifth thickness $t_5$ can be about 0.1 μm to about 0.5 μm, and the sum of the fourth thickness $t_4$ and the fifth thickness $t_5$ can be about 0.8 μm or more. However, depending on embodiments, the fifth thickness $t_5$ can have a thickness of less than about 0.1 μm or greater than about 0.5 μm, and the sum of the fourth and fifth thicknesses $t_4$ and $t_5$ can be less than about 0.8 μm.

An overcoat film 250 can be formed on the black matrix 240, and a window 260 can be formed on the overcoat film 250.

Since elements included in the OLED display 2 of FIG. 2 except for the black matrix 240 are the same as those included in the OLED display 1 of FIG. 1, detailed descriptions of the elements will not be repeated.

Figure 5:
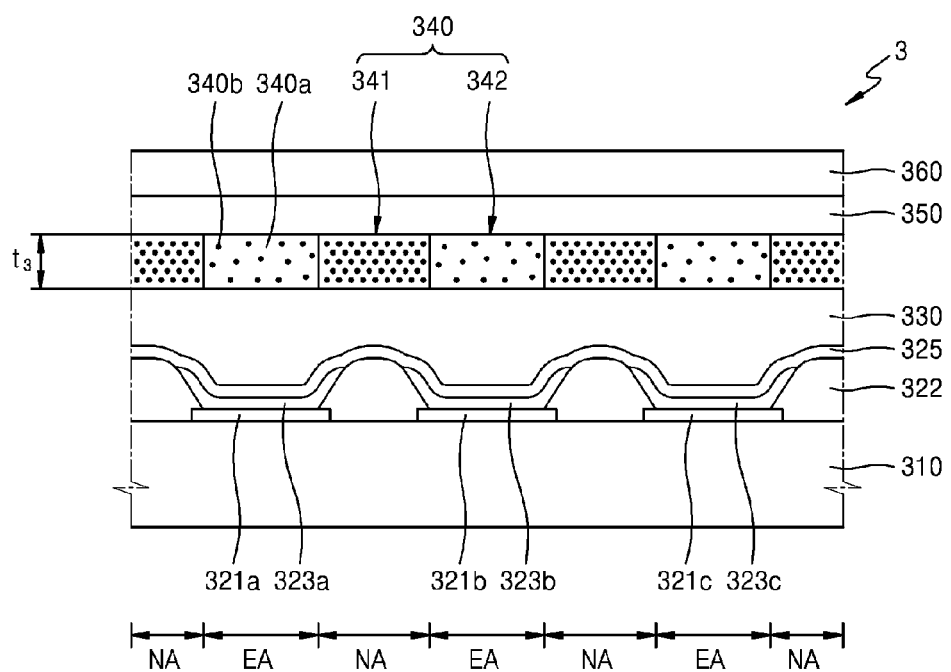
FIG. 5 is a cross-sectional view schematically illustrating an OLED display according to an exemplary embodiment.
Figure 6A:
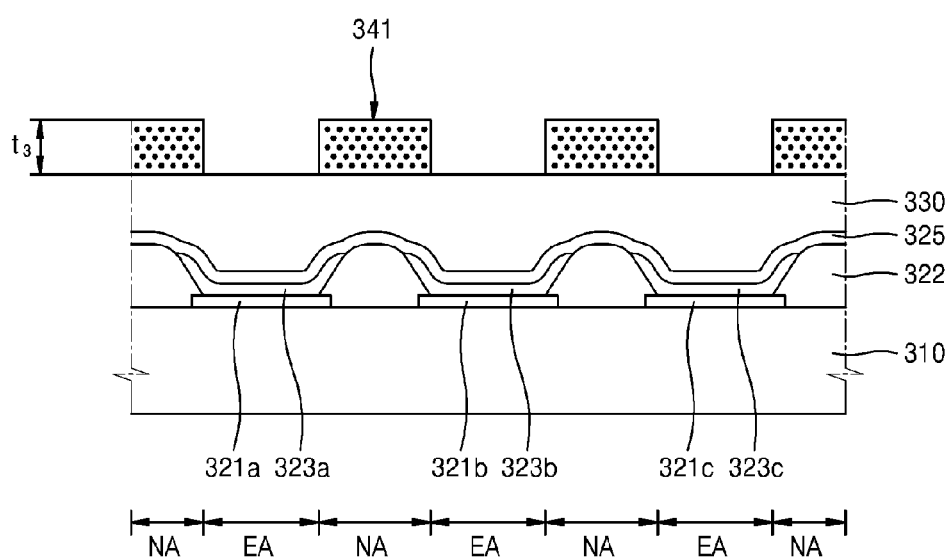
FIGS. 6A and 6B are cross-sectional views sequentially illustrating a portion of a method of manufacturing the OLED display of FIG. 5.
Figure 6B:
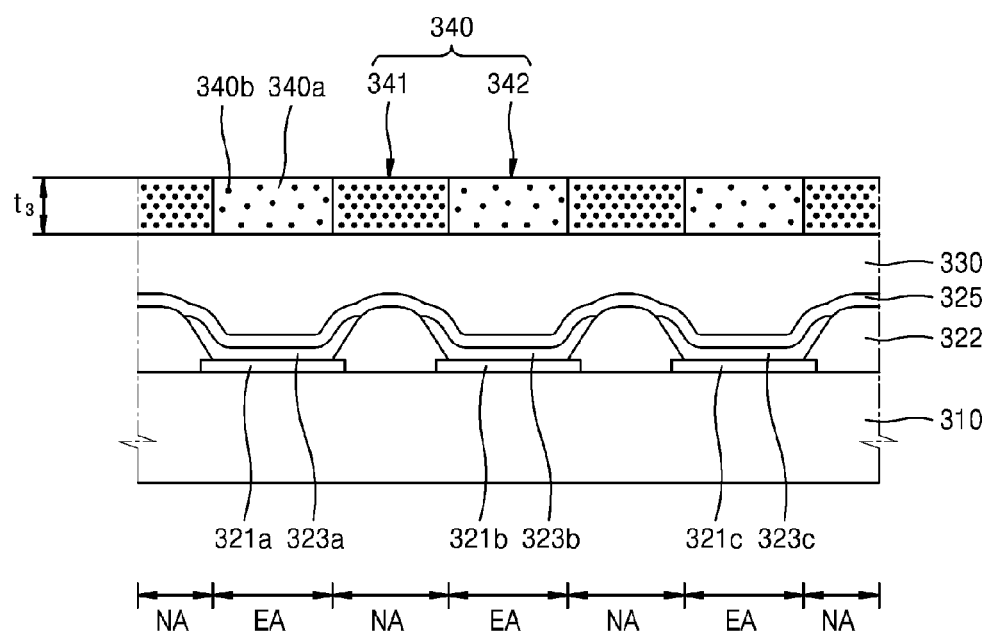

FIG. 5 is a cross-sectional view schematically illustrating an OLED display 3 according to an exemplary embodiment. FIGS. 6A and 6B are cross-sectional views sequentially illustrating a part of a method of manufacturing the OLED display 3 of FIG. 5.

Referring to FIG. 5, the OLED display 3 includes a substrate 310 defined as an emission area EA and a non-emission area NA, pixel electrodes 321a, 321b, and 321c formed on the emission area EA of the substrate 310, and intermediate layers 323a, 323b, and 323c including organic emission layers and formed on the pixel electrodes 321a, 321b, and 321c. The OLED display 3 also includes an opposite electrode 325 formed on the emission area EA and the non-emission area NA to cover the intermediate layers 323a, 323b, and 323c, and a black matrix 340 including a first light-blocking unit or first light-blocking portion 341 formed on an area corresponding to the non-emission area NA and a second light-blocking unit or second light-blocking portion 342 formed in an area corresponding to at least the emission area EA and having a greater light transmittance than the first light-blocking unit 341, on the opposite electrode 325.

A thin film encapsulating layer 330 can be formed between the opposite electrode 325 and the black matrix 340, and a PDL 322 can cover both edges of each of the pixel electrodes 321a, 321b, and 321c.

The black matrix 340 can be formed on the thin film encapsulating layer 330, and can include the first light-blocking unit 341 located in the non-emission area NA and the second light-blocking unit 342 located in the emission area EA.

The first and second light-blocking units 341 and 342 can have substantially the same thickness, i.e., a third thickness $t_3$, which is about 0.8 μm or more. Each of the first and second light-blocking units 341 and 342 can be formed as a resin 340a including black pigments 340b. A density of the black pigments 340b included in the first light-blocking unit 341 can be greater than a density of the black pigments 340b included in the second light-blocking unit 342. A visible light transmittance (or light transmittance) of the first light-blocking unit 341 can be about 0.2% or less and a visible light transmittance (or light transmittance) of the second light-blocking unit 342 can be about 40% to about 70%. However, depending on embodiments, the visible light transmittance of the first light-blocking unit 341 can be greater than about 0.2% and the visible light transmittance of the second light-blocking unit 342 can be less than about 40% or greater than about 70%.

That is, by making the densities of the black pigments 340b included in the resin 340a to be different, respective transmittances of the first light-blocking unit 341 and the second light-blocking unit 342 can be different.

Referring to FIGS. 6A and 6B, the method of manufacturing the OLED display 3 according to an exemplary embodiment includes forming the black matrix 340 on the thin film encapsulating layer 330. The forming of the black matrix 340 can include forming the first light-blocking unit 341 to have a third thickness $t_3$ in the non-emission area NA, and forming the second light-blocking unit 342 to have the third thickness $t_3$ that is substantially the same as that of the first light-blocking unit 341 in the emission area EA.

That is, first, the first light-blocking unit 341 is formed by using a material in which the black pigments 340b have a large density. Then, by using the first light-blocking unit 341 as banks, a material in which the black pigments 340b have a small density is filled in spaces defined by the first light-blocking unit 341 by using a method such as inkjet printing. Thus, the second light-blocking unit 342 can be formed.

An overcoat film 350 can be formed on the black matrix 240, and a window 360 can be formed on the overcoat film 350.

Since elements included in the OLED display 3 of FIG. 5 except for the black matrix 340 are the same as those included in the OLED display 1 of FIG. 1, detailed descriptions of the elements will not be repeated.

Figure 7:
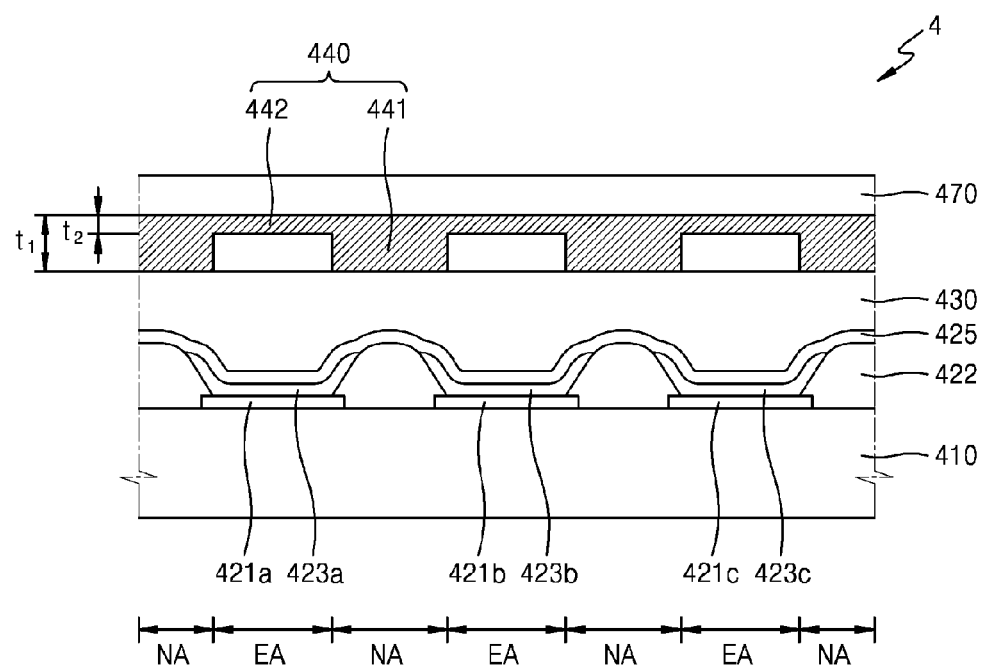
FIG. 7 is a cross-sectional view schematically illustrating an OLED display according to an exemplary embodiment.
Figure 8:
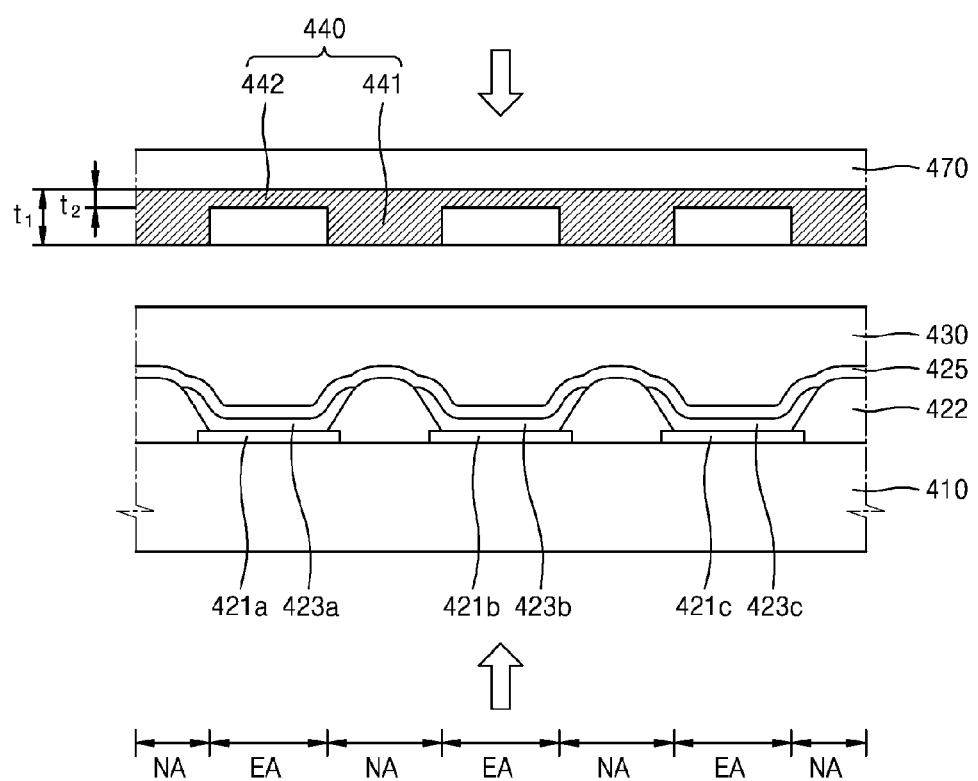
FIG. 8 is a cross-sectional view illustrating a portion of a method of manufacturing the OLED display of FIG. 7.

FIG. 7 is a cross-sectional view schematically illustrating an OLED display 4 according to an exemplary embodiment. FIG. 8 is a cross-sectional view illustrating a part of a method of manufacturing the OLED display 4 of FIG. 7.

Referring to FIG. 7, the OLED display 4 includes a substrate 410 defined as an emission area EA and a non-emission area NA, pixel electrodes 421a, 421b, and 421c formed on the emission area EA of the substrate 410, and intermediate layers 423a, 423b, and 423c including organic emission layers and formed on the pixel electrodes 421a, 421b, and 421c. The OLED display 4 also includes an opposite electrode 425 formed on the emission area EA and the non-emission area NA to cover the intermediate layers 423a, 423b, and 423c, and a black matrix 440 including a first light-blocking unit or first light-blocking portion 441 formed on an area corresponding to the non-emission area NA and a second light-blocking unit or second light-blocking portion 442 formed in an area corresponding to the at least emission area EA and having a greater light transmittance than the first light-blocking unit 441, on the opposite electrode 425. A thin film encapsulating layer 430 can be formed between the opposite electrode 425 and the black matrix 440, and a PDL 442 can cover both edges of each of the pixel electrodes 421a, 421b, and 421c.

The OLED display 4 can include an encapsulating substrate 470 that faces the substrate 410. The black matrix 440 can be formed on a surface of the encapsulating substrate 470, the surface which faces the substrate 410. The black matrix 440 can include the first light-blocking unit 441 located in the non-emission area NA and the second light-blocking unit 442 located in the emission area EA.

The black matrix 440 can prevent external light reflection so that visibility of the OLED display 4 is improved. According to an exemplary embodiment, a visible light transmittance (or light transmittance) of the first light-blocking unit 441 can be about 0.2% or less, and a visible light transmittance (or light transmittance) of the second light-blocking unit 442 can be about 40% to about 70%.

According to an exemplary embodiment, the first and second light-blocking units 441 and 442 can be formed of a substantially identical material, for example, a photosensitive resin including black pigments. The first and second light-blocking units 441 and 442 can have different thicknesses so that there is a difference between respective visible light transmittances. That is, the first light-blocking unit 441 can have a first thickness $t_1$ and the second light-blocking unit 442 can have a second thickness $t_2$ that is less than the first thickness $t_1$.

According to an exemplary embodiment, the first thickness $t_1$ is about 0.8 μm or more and the second thickness $t_2$ can be about 0.1 μm to about 0.5 μm. As described above, the first light-blocking unit 441 having the first thickness $t_1$ can have a visible light transmittance (or light transmittance) of about 0.2% or less, and the second light-blocking unit 442 having the second thickness $t_2$ can have a visible light transmittance (or light transmittance) of about 40% to about 70%. However, depending on embodiments, the visible light transmittance of the first light-blocking unit 341 can be greater than about 0.2% and the visible light transmittance of the second light-blocking unit 342 can be less than about 40% or greater than about 70%.

Referring to FIG. 8, the method of manufacturing the OLED display 4 according to an exemplary embodiment includes after forming the encapsulating substrate 470 that faces the substrate 410, forming the black matrix 440 on a surface of the encapsulating substrate 470, the surface which faces the substrate 410, and aligning the substrate 410 and the encapsulating substrate 470.

The black matrix 440 can be formed by using the method described with reference to FIGS. 2C and 2D.

Since elements included in the OLED display 4 of FIG. 7 except for the encapsulating substrate 470 and the black matrix 440 are the same as those included in the OLED display 1 of FIG. 1, detailed descriptions of the elements will not be repeated.

Figure 9:
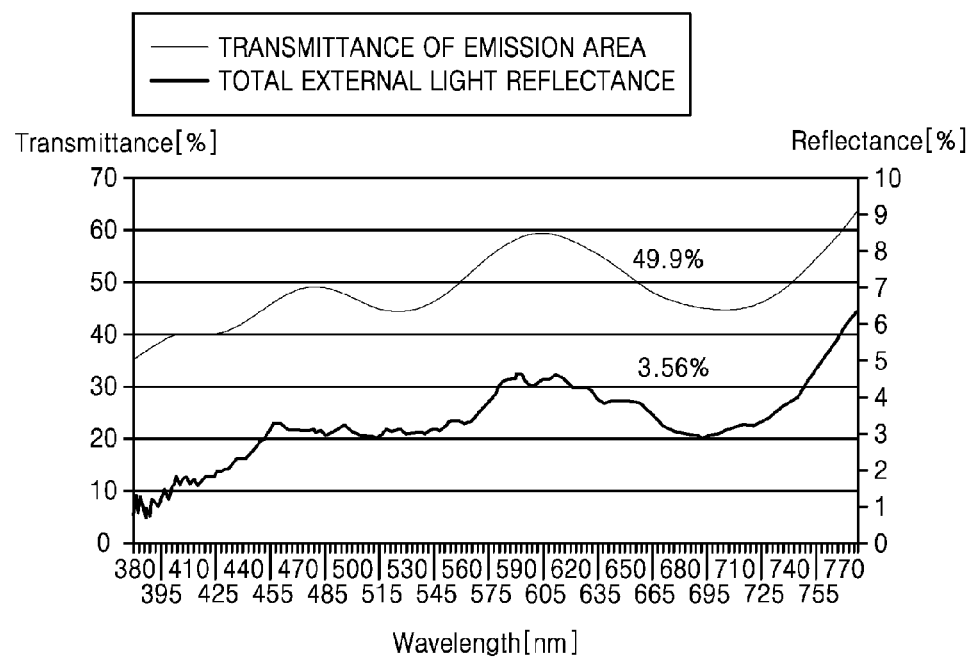
FIG. 9 is a graph illustrating an external light reflectance and a transmittance of light emitted from an intermediate layer, versus wavelengths, of the OLED display of FIG. 1.

FIG. 9 is a graph illustrating an external light reflectance and a transmittance of light emitted from an intermediate layer versus wavelengths, in the OLED display 1 of FIG. 1.

Referring to FIG. 9, an average of the external light reflectance of the OLED display 1 is about 3.56%, and an average of the transmittance of light emitted from the intermediate layers 123a, 123b, and 123c is about 49.9%.

That is, the OLED display 1 can efficiently prevent external light reflection without using a polarizer. Also, the light extraction efficiency of the OLED display 1 can be similar to or greater than the light extraction efficiency when a polarizer having a light transmittance of about 40% to about 50% is used.

The OLED displays 1 to 4 according to exemplary embodiments can be manufactured as flexible displays by not using a polarizer but respectively including the black matrices 140, 240, 340, and 440 formed in the emission area EA and the non-emission area NA. Thus, visibility of the OLED displays 1 to 4 can have improved visibility by efficiently reducing external light reflection.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. An organic light-emitting diode (OLED) display comprising:
   a substrate having an emission area and a non-emission area;
   a pixel electrode formed in the emission area;
   an intermediate layer formed over the pixel electrode and comprising an organic emission layer;
   an opposite electrode formed in the emission and non-emission areas and at least partially covering the intermediate layer; and
   a black matrix formed over the opposite electrode and comprising i) a first light-blocking portion formed in the non-emission area and ii) a second light-blocking portion formed in the emission area and having light transmittance greater than that of the first light-blocking portion, wherein the second light-blocking portion completely covers the emission area.

2. The OLED display of claim 1, wherein the light transmittance of the first light-blocking portion is 0.2% or less, and wherein the light transmittance of the second light-blocking portion is 40% to 70%.

3. The OLED display of claim 1, wherein the first light-blocking portion has a first thickness and the second light-blocking portion has a second thickness less than the first thickness.

4. The OLED display of claim 3, wherein the first and second light-blocking portions are formed of the same material.

5. The OLED display of claim 3, wherein the first thickness is 0.8 μm or more, and wherein the second thickness is 0.1 μm to 0.5 μm.

6. The OLED display of claim 1, wherein the first and second light-blocking portions have the same thickness.

7. The OLED display of claim 1, further comprising an encapsulating substrate facing the substrate, wherein the black matrix is formed over a surface of the encapsulating substrate, and wherein the surface faces the substrate.

8. The OLED display of claim 1, further comprising a thin film encapsulating layer formed between the opposite electrode and the black matrix.

9. An organic light-emitting diode (OLED) display comprising:
   a substrate having an emission area and a non-emission area;
   a pixel electrode formed in the emission area;
   an intermediate layer formed over the pixel electrode and comprising an organic emission layer;
   an opposite electrode formed in the emission and non-emission areas and at least partially covering the intermediate layer; and
   a black matrix formed over the opposite electrode and comprising i) a first light-blocking portion formed in the non-emission area and ii) a second light-blocking portion formed in the emission area and having light transmittance greater than that of the first light-blocking portion, wherein the black matrix is formed of a resin comprising black pigments, and wherein the density of the black pigments in the first light-blocking portion is greater than the density of black pigments in the second light-blocking portion.

10. The OLED display of claim 9, wherein the thickness of the first and second light-blocking portions is 0.8 μm or more.

* * * * *